United States Patent
Furuta et al.

(10) Patent No.: US 6,356,109 B1
(45) Date of Patent: Mar. 12, 2002

(54) PROGRAMMABLE DEVICE

(75) Inventors: Koichiro Furuta; Taro Fujii; Masato Motomura, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/500,846

(22) Filed: Feb. 10, 2000

(30) Foreign Application Priority Data

Feb. 10, 1999 (JP) ............................................. 11-033252

(51) Int. Cl.[7] .......................................... H03K 19/177
(52) U.S. Cl. ............................. 326/41; 326/40; 326/39; 326/38
(58) Field of Search .............................. 326/38, 39, 40, 326/41

(56) References Cited

U.S. PATENT DOCUMENTS

| | | | |
|---|---|---|---|
| 4,975,601 A | | 12/1990 | Steele |
| 5,787,007 A | * | 7/1998 | Bauer .......................... 364/489 |
| 6,118,707 A | * | 9/2000 | Gould et al. ............ 365/189.08 |
| 6,150,838 A | * | 11/2000 | Wittig et al. ................... 326/39 |
| 6,157,213 A | * | 12/2000 | Voogel ......................... 326/41 |
| 6,167,559 A | * | 12/2000 | Furtek et al. .................. 716/16 |

FOREIGN PATENT DOCUMENTS

| | | |
|---|---|---|
| EP | 0 748 052 A1 | 12/1996 |
| GB | 2 279 168 A | 12/1994 |
| GB | 2 279 830 A | 1/1995 |
| GB | 2 305 759 A | 4/1997 |
| JP | Sho 57-129536 | 8/1982 |
| JP | 7-273640 | 10/1995 |
| JP | Hei 8-51356 | 2/1996 |
| JP | 9-83347 | 3/1997 |
| JP | 9-186581 | 7/1997 |
| JP | 10-240678 | 9/1998 |
| JP | Hei 11-24891 | 1/1999 |
| JP | Hei 11-510038 | 8/1999 |
| WO | WO 91/07015 | 5/1991 |

OTHER PUBLICATIONS

PCT WO 97/44730.

* cited by examiner

*Primary Examiner*—Michael Tokar
*Assistant Examiner*—Vibol Tan
(74) *Attorney, Agent, or Firm*—Sughrue Mion, PLLC

(57) ABSTRACT

Disclosed is a programmable device that has a programmable cell that operates as programmable logic or memory by internal storage means and a wiring network that is composed of a plurality of wiring lines and determines the line-connection state of a wiring group according to the storage means. In this device, the programmable cell is provided with n sets of input/output port groups, where n is an integer of 2 or more, and the wiring network is of m sets, where m is an integer of 2 or more.

23 Claims, 12 Drawing Sheets

PROGRAMMABLE DEVICE

FIELD OF THE INVENTION

This invention relates to a programmable device, and more particularly to, a programmable cell and a wiring network composing a programmable device, e.g., FPGA (field programmable gate array).

BACKGROUND OF THE INVENTION

Programmable devices, typically FPGA, are LSIs that store configuration information to specify how to configure a hardware, and that create a desired hardware according to instructions from the configuration information. Recently, according as the scale of hardware capable of being created by the programmable device is enlarged due to advance in semiconductor fabrication technology, the switching from gate array LSI to programmable device is accelerated and is getting a lot of attention. In general, such a programmable device is needed to create a hardware with arbitrary functions, but it is difficult to create a large-scale circuit because the circuit scale of programmable cell to create an arbitrary logic is increased due to the general-purpose requirement. So, a cell and chip architecture capable of mounting a larger circuit is needed.

Also, depending on a circuit created, the wiring between logic gates is increased, and therefore the programmable cell is short of wiring resource. So, more wiring resource is required.

To comply with these requirements, for example, Japanese patent application No. 10-309285 (1998) discloses a technique that arbitrary logic, memory and wire connection are created by programmable cells, thus satisfying the requirements to hardware scale and wiring resource. In this technique, the memory and wire connection are provided as modes of programmable cell. Thus the memory, which yields an insufficiency if provided by a logic gate, can be created sufficiently. Also, by using the cell as the wiring resource when being short of wiring resource, a large-scale circuit can be created efficiently.

Also, Japanese patent application laid-open No. 7-273640 (1995) discloses a FPGA device where a programmable logic circuit, as shown in FIG. 1, includes a multiplexer 103 to switch between data stored in a memory cell 102 and external data signal as one input to a comparator 104. By arraying such programmable logic circuits and decoders (not shown) two-dimensionally, compact ROM, associative memory and multi-port register file are configured.

Japanese patent application laid-open No. 9-83347 (1997) discloses FPGA with multi-port RAM where first and second RAM cells 102, 108 are, as shown in FIG. 2, connected to corresponding first and second read/write ports 104, 110. The RAM cell functions independently as a single-port RAM when switched off by a switching device 114. However, the RAM cell shares data to function collectively as a double-port RAM when connected by the switching device 114.

Japanese patent application laid-open No. 9-186581 (1997) discloses a field programmable memory array where address decoder, hierarchical bit-line array, input/output device are, as shown in FIG. 3, programmable, and each part of array can be programmed into selection mode.

Japanese patent application laid-open No. 10-240678 discloses an extended input/output bus where as show in FIG. 4a FPGA 3 disposed between a master processor 1 and a slave processor 4 operates as a FIFO (first-in first-out memory) composed registers of arbitrary number by selecting configuration signal D. Multiple configuration signals D are read from configuration ROM 7, and a selector 6 selects one of them.

However, in prior arts, when it is not necessary to use the programmable cell as wiring resource or memory, the wiring-resource mode and the memory mode of programmable cell becomes unnecessary, and therefore an overhead of circuit and area provided in programmable cell is useless. Also, due to the addition of mode, the circuit and area of one programmable cell increases and the number of programmable cells mountable on the chip decreases. Therefore, the circuit scale created reduces. Furthermore, for example, when creating a FIFO circuit, a programmable cell that is unable to do the write and read of memory simultaneously requires a lot of programmable cells.

Here, the overhead due to addition of mode in programmable cell is explained.

FIG. 5 shows an example of configuration that a 4-input 1-output logic for arbitrary logic and a 16-bit RAM are created by mode switching. When this circuit operates as the 4-input 1-output circuit, storage information in storage element 801 is unnecessary to rewrite because it takes the content of a look-up table to enable an arbitrary logic. So, in operation, data are input to IN1 to IN4, and then information of a storage element 801 corresponding to an address input is read, thereby creating an arbitrary logic. On the other hand, when this circuit operates as the 16-bit RAM, in read operation, address data is input to IN1 to IN4, and then information of storage element 801 corresponding to the address data is read. This is the same operation as in case of 4-input 1-output circuit. However, when writing data, new paths are need and therefore write buffers 805 and its associated wiring become an overhead.

FIG. 6 shows an example of programmable cell that a 4-input 1-output logic for arbitrary logic, a 16-bit RAM, a crossbar switch of 4 in the vertical direction and 4 in the horizontal directions are created by mode switching. In this programmable cell, neighboring programmable cells in vertical and horizontal and the wiring networks are connected by input/output ports 901. Also, selectors are provided neighboring the programmable cell in the vertical and horizontal directions, and they control the connection between the input/output port and the memory means. In operation, when the programmable cell operates as the 4-input 1-output circuit or 16-bit RAM, data and address signal are input through the address input terminal, output through the data output terminal. Also, when the programmable cell operates as the crossbar switch, the neighboring programmable cells in vertical and horizontal, the wiring networks and the memory means are connected by the wiring of 4 each in vertical and horizontal directions, and the vertical wiring and horizontal wiring are connected together according to information of storage element. Therefore, the main overhead of the crossbar switch mode is brought by the vertical and horizontal wiring and the switch elements.

SUMMARY OF THE INVENTION

Accordingly, it is an object of the invention to provide a programmable device that the area efficiency in logic circuit is improved to offer a larger-scale circuit.

It is a further object of the invention to provide a programmable cell that offers multi-port memory.

According to the invention, a programmable device, comprises:

a programmable cell that operates as programmable logic or memory by internal storage means; and a wiring network that is composed of a plurality of wiring lines and determines the line-connection state of a wiring group according to the storage means;

wherein the programmable cell is provided with n sets of input/output port groups, where n is an integer of 2 or more, and the wiring network is of m sets, where m is an integer of 2 or more.

According to another aspect of the invention, a programmable device, comprises:

a two-dimensional array of storage elements;

a decoder to select the storage element;

a buffer to input write signal; and a selector to output selecting the output of the storage element;

wherein the decoder and the selector are configured into 2 or more groups, the control signal for the 2 or more groups is input to the decoder and the selector, and the storage element is configured into a group that the write signal is written and a group that signal written already is read out.

According to another aspect of the invention, a programmable device, comprises:

a two-dimensional array of programmable cells; and two or more wiring network groups;

wherein each of the input/output port groups of programmable cell is connected to each of the wiring network groups, and signal with a same or different functions is input to each of the wiring groups.

According to another aspect of the invention, a programmable device, comprises:

a two-dimensional array of pairs of storage element and switch element; and a selector to select one of the pairs;

wherein data signal, address signal and control signal are input to the selector, the pair is operated as either storage element or switch element according to the control signal, and output from the output port of the pair is output through the selector.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
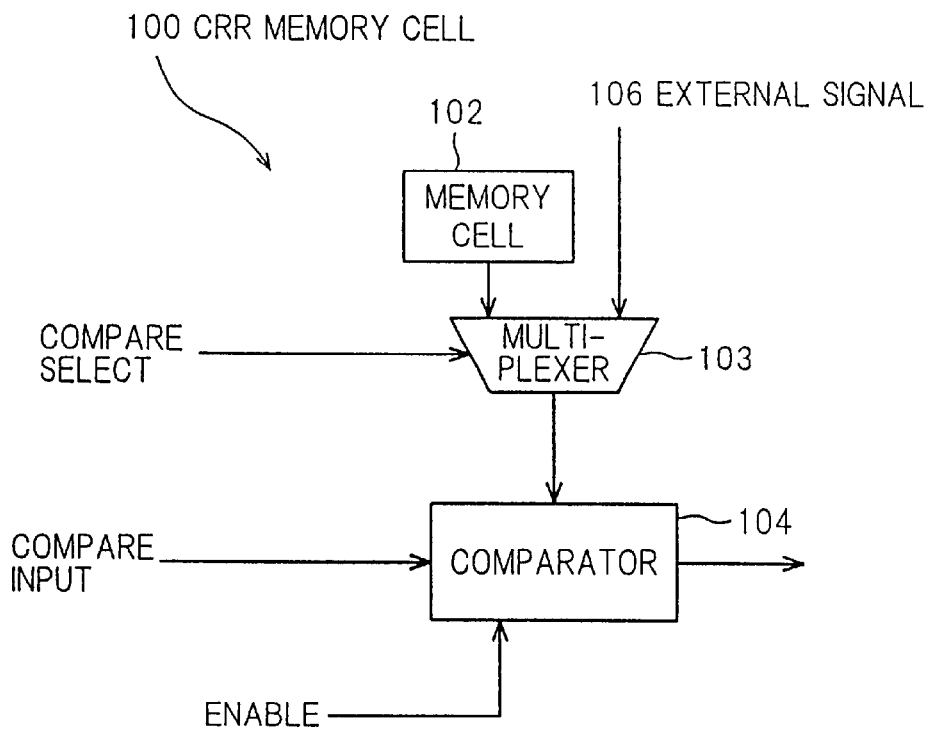
FIG. 1 is a block diagram showing the conventional FPGA.
Figure 2:
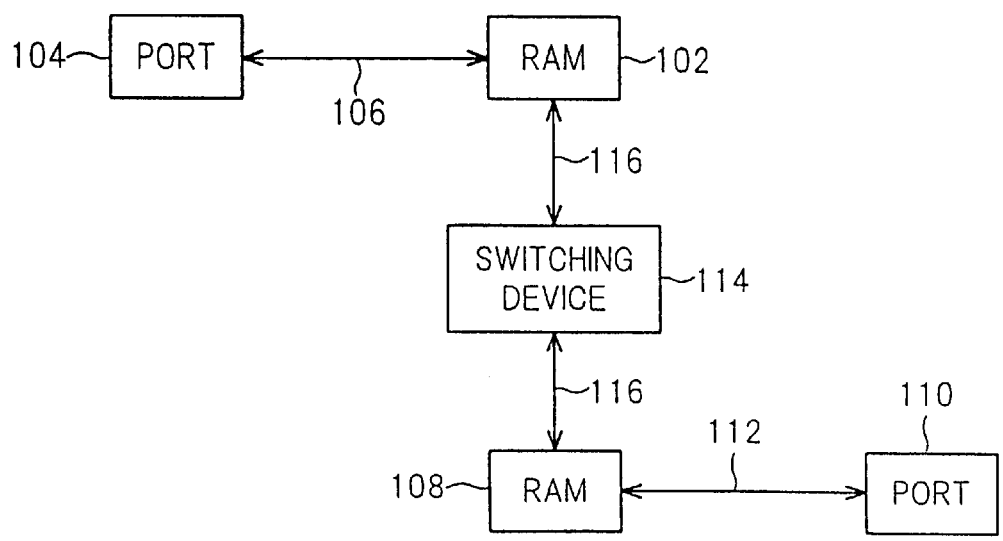
FIG. 2 is a block diagram showing the other conventional FPGA.
Figure 3:
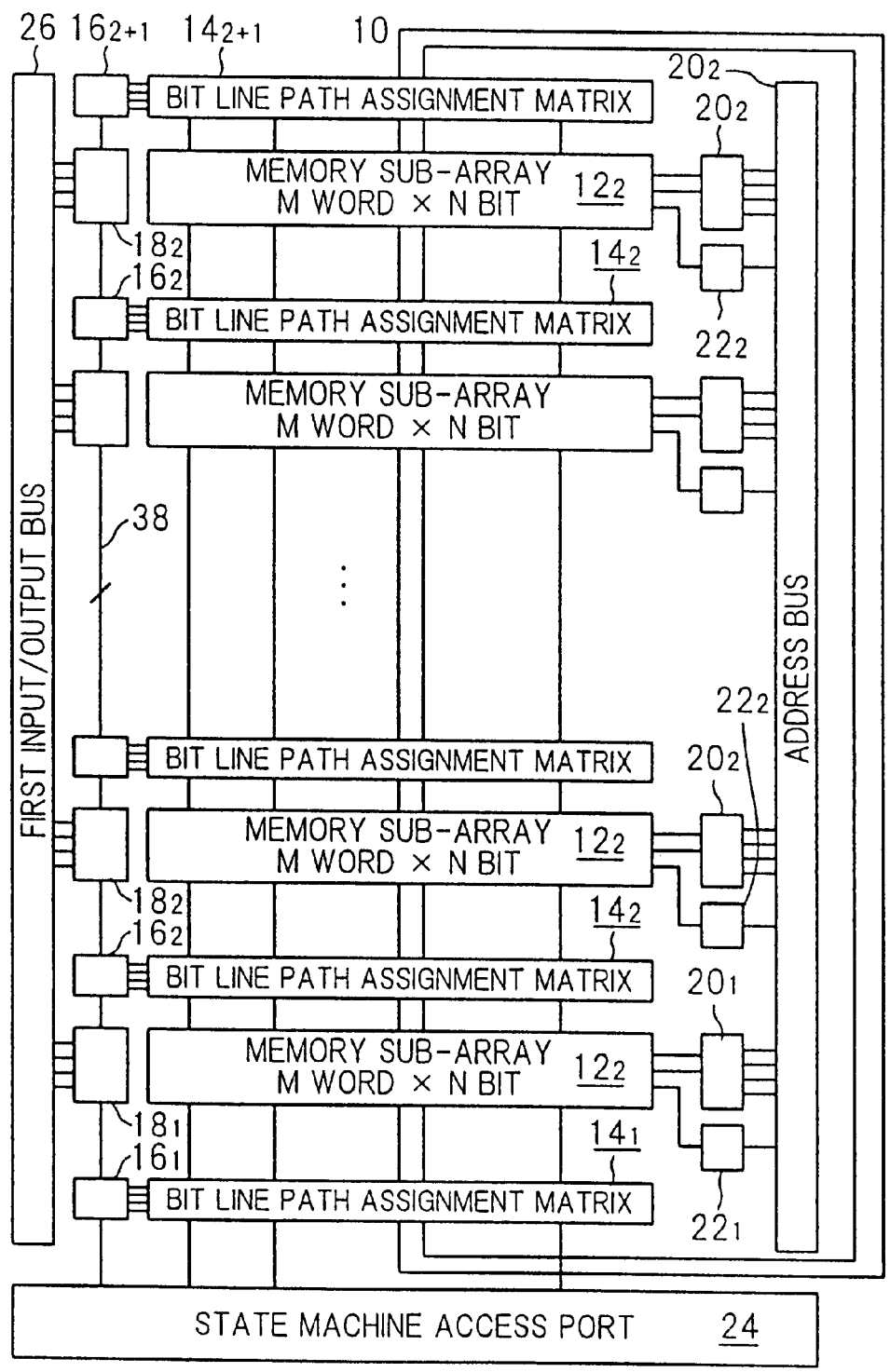
FIG. 3 is a block diagram showing the further conventional FPGA.
Figure 4:
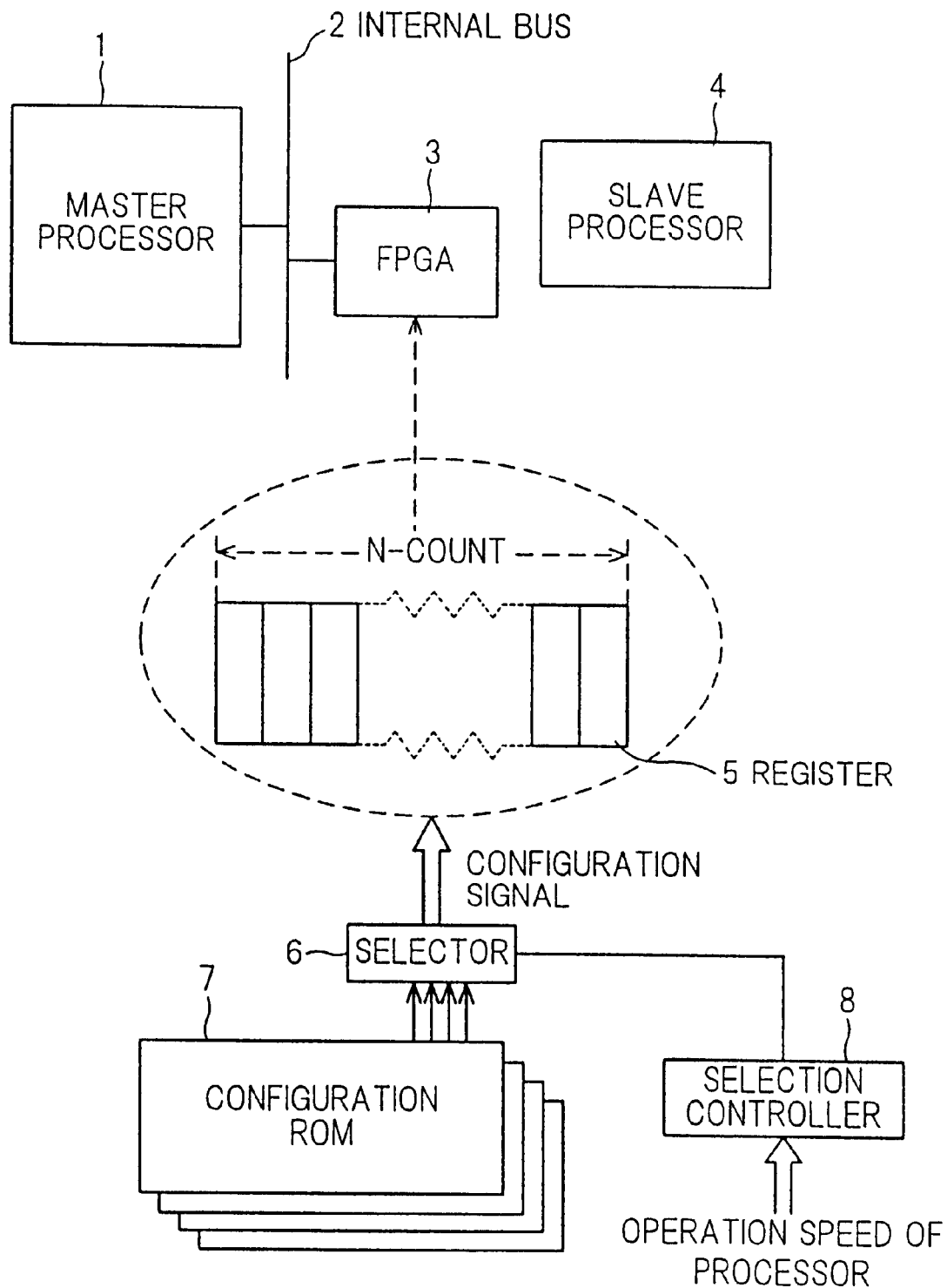
FIG. 4 is a block diagram showing the still further conventional FPGA.
Figure 5:
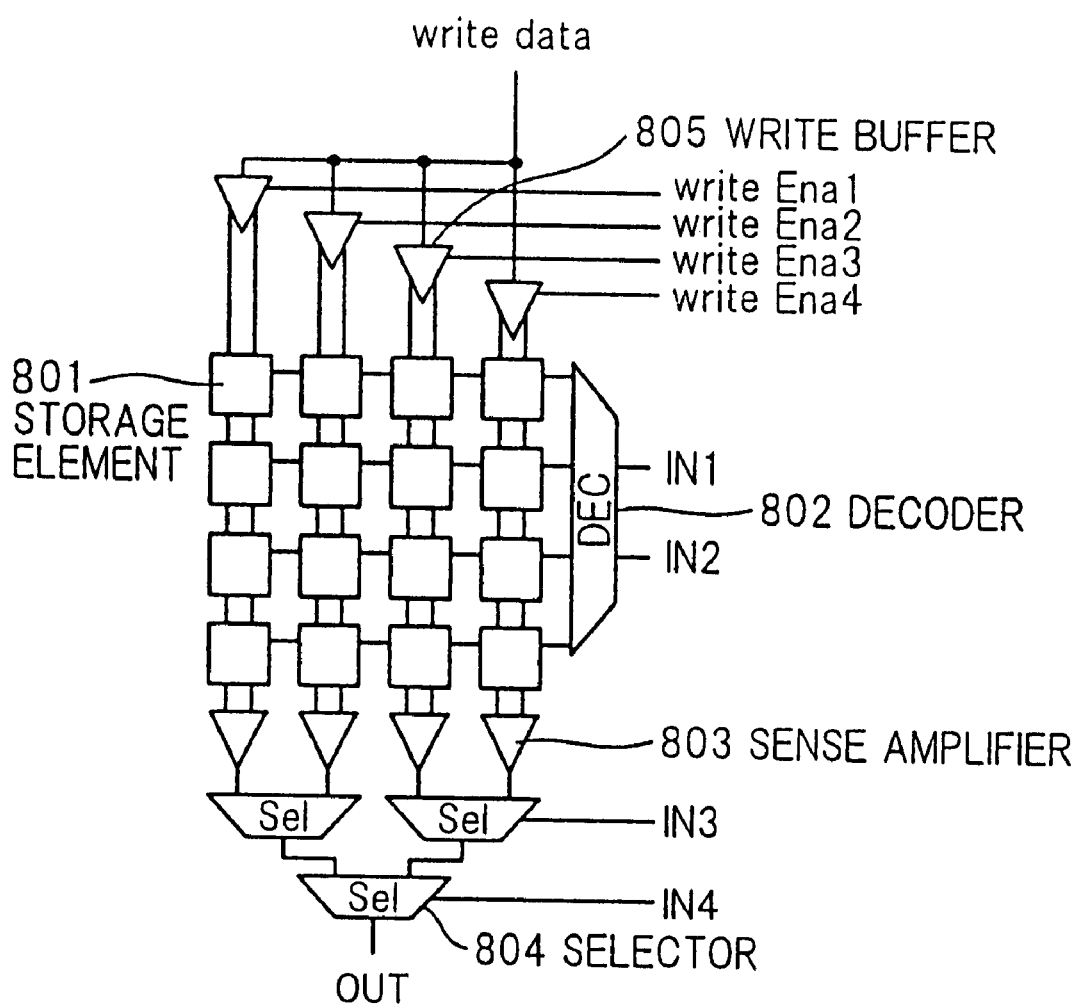
FIG. 5 is a block diagram showing a conventional example of FPGA configuration that a 4-input 1-output logic for arbitrary logic and a 16-bit RAM are created by mode switching.
Figure 6:
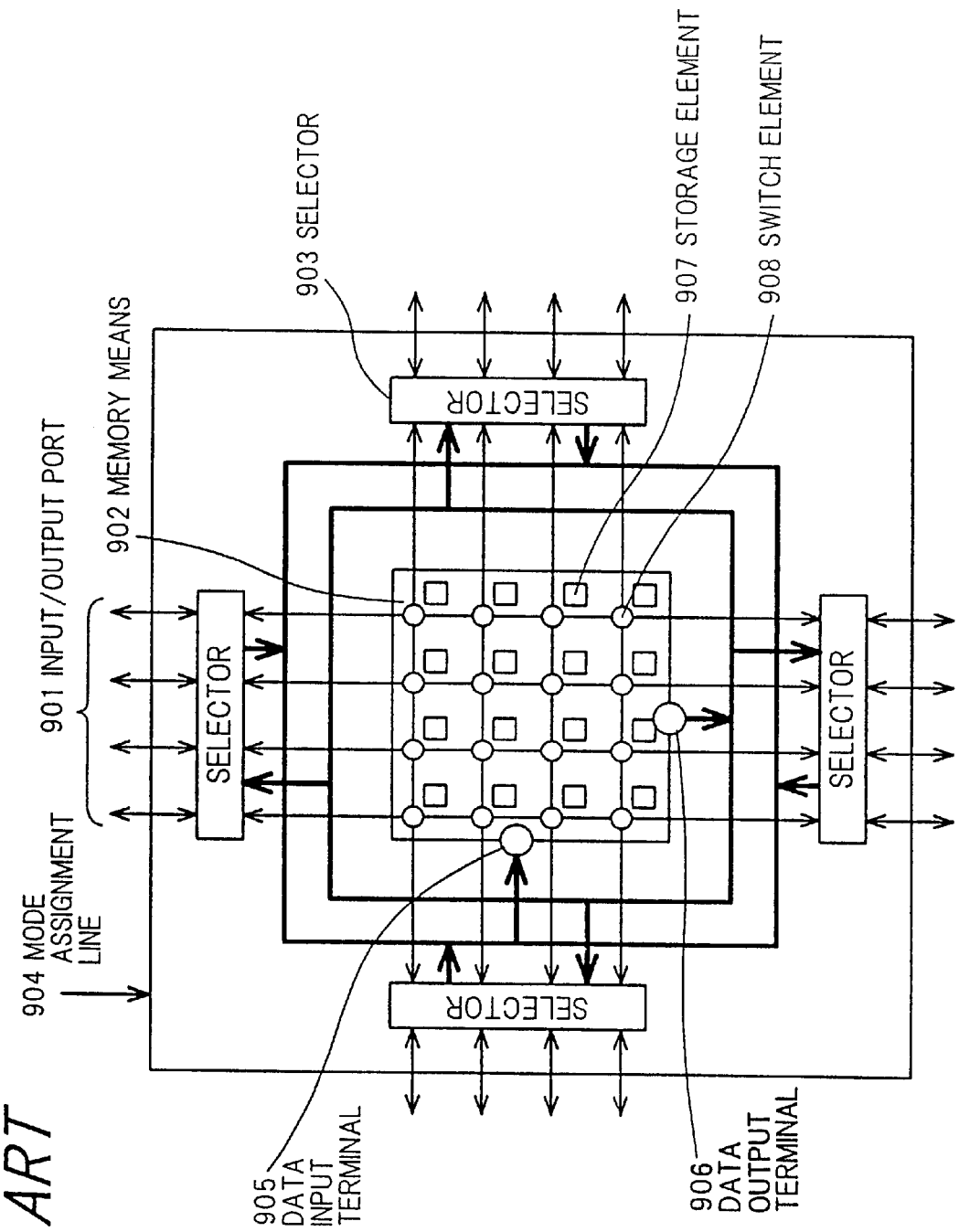
FIG. 6 is a block diagram showing a conventional example of programmable cell that a 4-input 1-output logic for arbitrary logic, a 16-bit RAM, a crossbar switch of 4 in the vertical direction and 4 in the horizontal directions are created by mode switching.

The preferred embodiments of the invention will be explained referring to the drawings.

Figure 7:
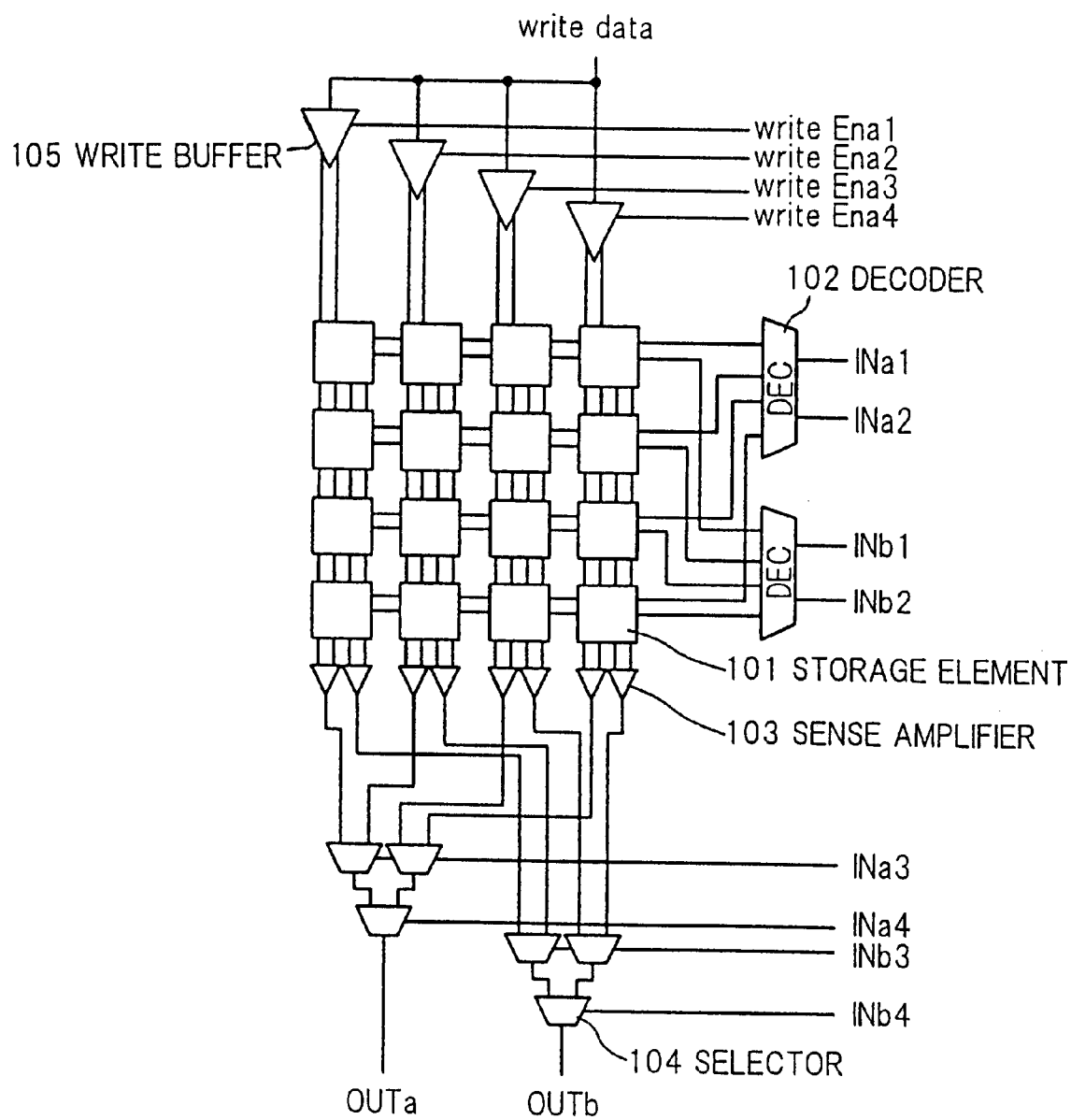
FIG. 7 is a block diagram showing a programmable device in a preferred embodiment according to the invention, where two sets of same-logic 4-input 1-output circuits (2 reads) or a 16-bit 2-port (1 read and 1 write) RAM are created.

FIG. 7 shows a circuit composition that with two sets of input/output ports, two sets of 4-input 1-output circuits (2 reads) or a 16-bit 2-port (1 read and 1 write) RAM are provided.

In this circuit, storage elements 101 are arrayed like a matrix, and are connected by two sets of word lines and data line pairs. The connected word line is connected to a decoder 102. A sense amplifier 103 is connected to the data line pair of storage element 101 and a selector 104. The selector 104 selects data of sense amplifier 103 according to signal INa3, INa4, INb3 and INb4, then outputting it to OUTa and OUTb. A write buffer 105 is connected to either of the data line pair of storage element 101, propagating write data to the data line pair when write Ena1 to 4 is activated.

Thus, when the present circuit operates as the 4-input 1-output circuit, two sets of input-port groups INa1 to INa4 and INb1 to INb4 each select one of the 16 storage elements 101, and output information to OUTa and OUTb. In this case, since information of storage element 101 is common regardless of the input port, the logic of 4-input 1-output circuit is equal.

Also, when the present circuit operates as the 16-bit 2-port RAM, in the read of data, information of storage element 101 is read according to data input through the input-port groups INa1 to INa4 and INb1 to INb4. But the write of data is conducted through the buffer 105 from one port, and therefore the remaining port is assigned to the read operation.

As described above, in the present circuit, the most part of the write buffer 105 and storage element 101 is used in common, and the double logic and 2-port RAM can be provided while suppressing the area overhead.

Figure 8:
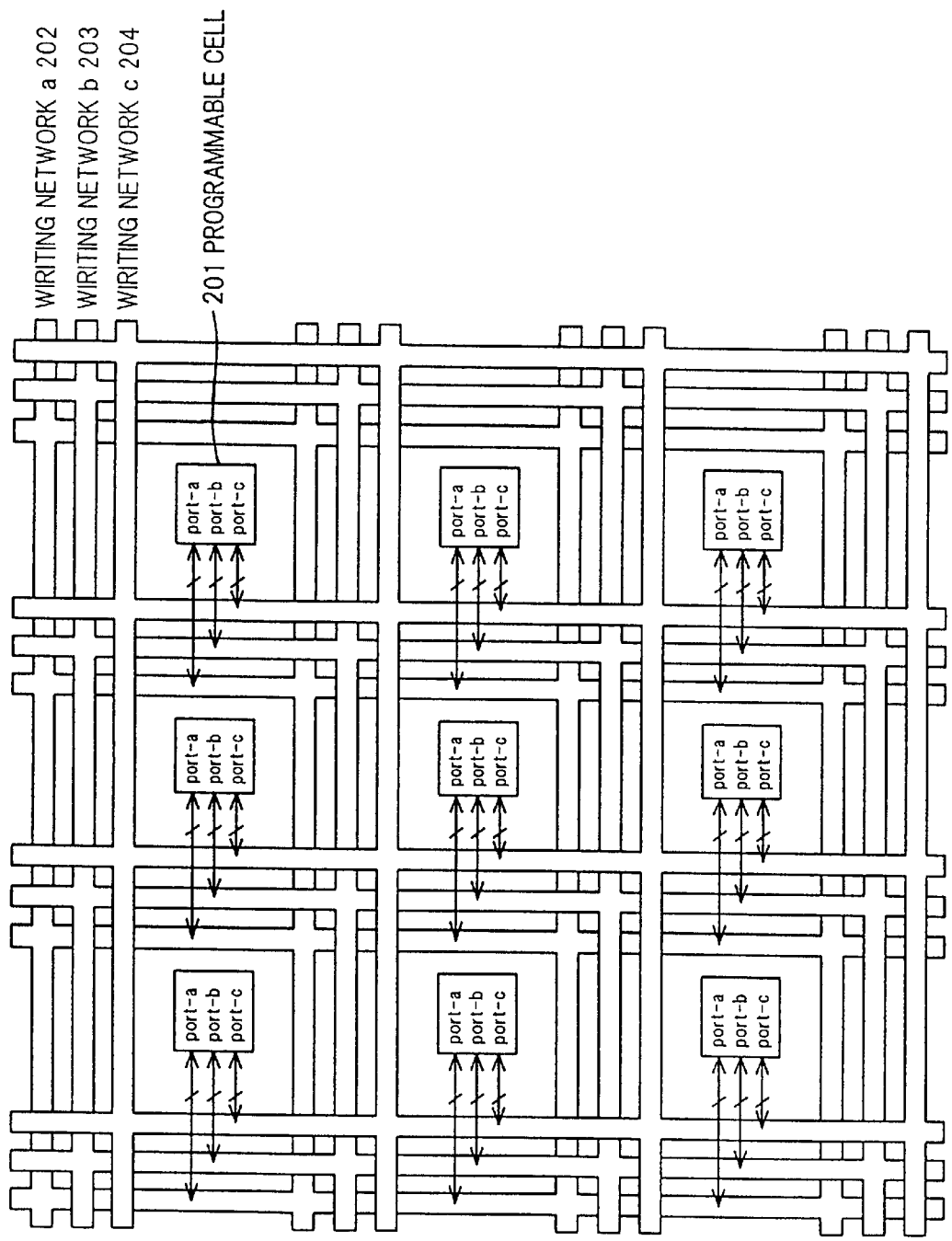
FIG. 8 is a block diagram showing a programmable device in another preferred embodiment of the invention.

FIG. 8 shows a programmable device that programmable cells 201 with a group of three input/output ports (port-a, port-b and port-c) are arrayed and the programmable cells 201 are connected using three wiring networks (wiring network a 202, wiring network b 203 and wiring network c 204).

In this circuit, the three input/output ports for each programmable cell are connected by separate wiring networks, thereby allowing an arbitrary connection, e.g. between port-a and port-b, in the same input/output port group.

Accordingly, for example, with the input/output port group for programmable cell 201 and the three wiring networks that are equally composed and connected, the programmable device can be used as three circuits provided with a same function, the triple performance can be obtained while suppressing the area overhead.

Figure 9:
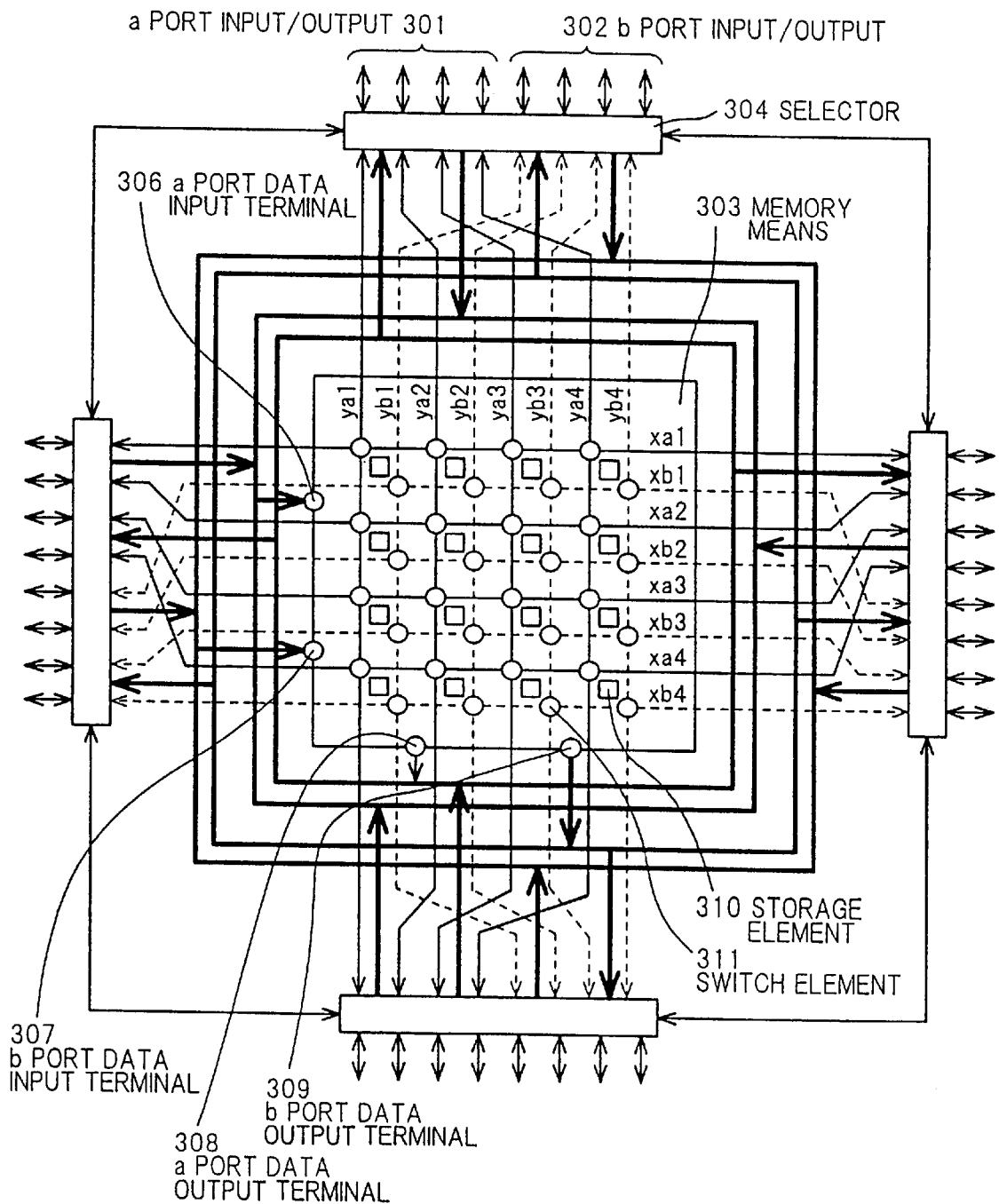
FIG. 9 is a block diagram showing a programmable cell in another preferred embodiment of the invention, where two sets of 4-input 1-output circuits, a 16-bit 2-port RAM and two sets of crossbar switches of 4 each in the vertical and horizontal directions are created by mode switching.

FIG. 9 shows the composition of a programmable cell in the preferred embodiment of the invention, where two sets of 4-input 1-output circuits, a 16-bit 2-port RAM and two sets of crossbar switches of 4 each in the vertical and horizontal directions are created by mode switching.

In this circuit, selectors 304 to connect with the external or internal of the circuit are disposed up/down and right/left, optionally right up/down and left up/down, in order to give connections with neighboring programmable cells.

The selector 304 is connected to the other selector 304, memory means 303, input/output port group (a-port input/output 301, b-port input/output 302) through exclusive lines, thereby signal can be connected arbitrarily.

In operation, in case of a programmable cell configured as two sets of 4-input 1-output circuits or a 16-bit 2-port RAM, data and address signal are input from the input/output port group through the selector 304 to a-port data input terminal 306 and b-port data input terminal 307, and then output from a-port data output terminal 308 and b-port data output terminal 309 through the selector 304 to the input/output port group.

Also, in case of the mode of crossbar switch, neighboring programmable cells, wiring networks and memory means 303 are connected by 4 wiring lines in the vertical and horizontal directions, respectively, and operate as a crossbar switch that conducts the connection between the vertical and horizontal wiring lines according to a storage element 310. In this case, in the memory means 303 shown in FIG. 9, switch elements 311 are disposed like a matrix at all the intersection points of 4 wiring lines each in the vertical and horizontal directions connected with a-port input/output 301 and b-port input/output 302, by using 1-bit storage element, two switch elements 311 at same position of the a-port wiring group and b-port wiring group are controlled.

Thus, in this programmable cell, by using the storage element 310 in common, two sets of 4-input 1-output circuits, a 16-bit 2-port RAM or two sets of crossbar switches can be configured.

Figure 10:
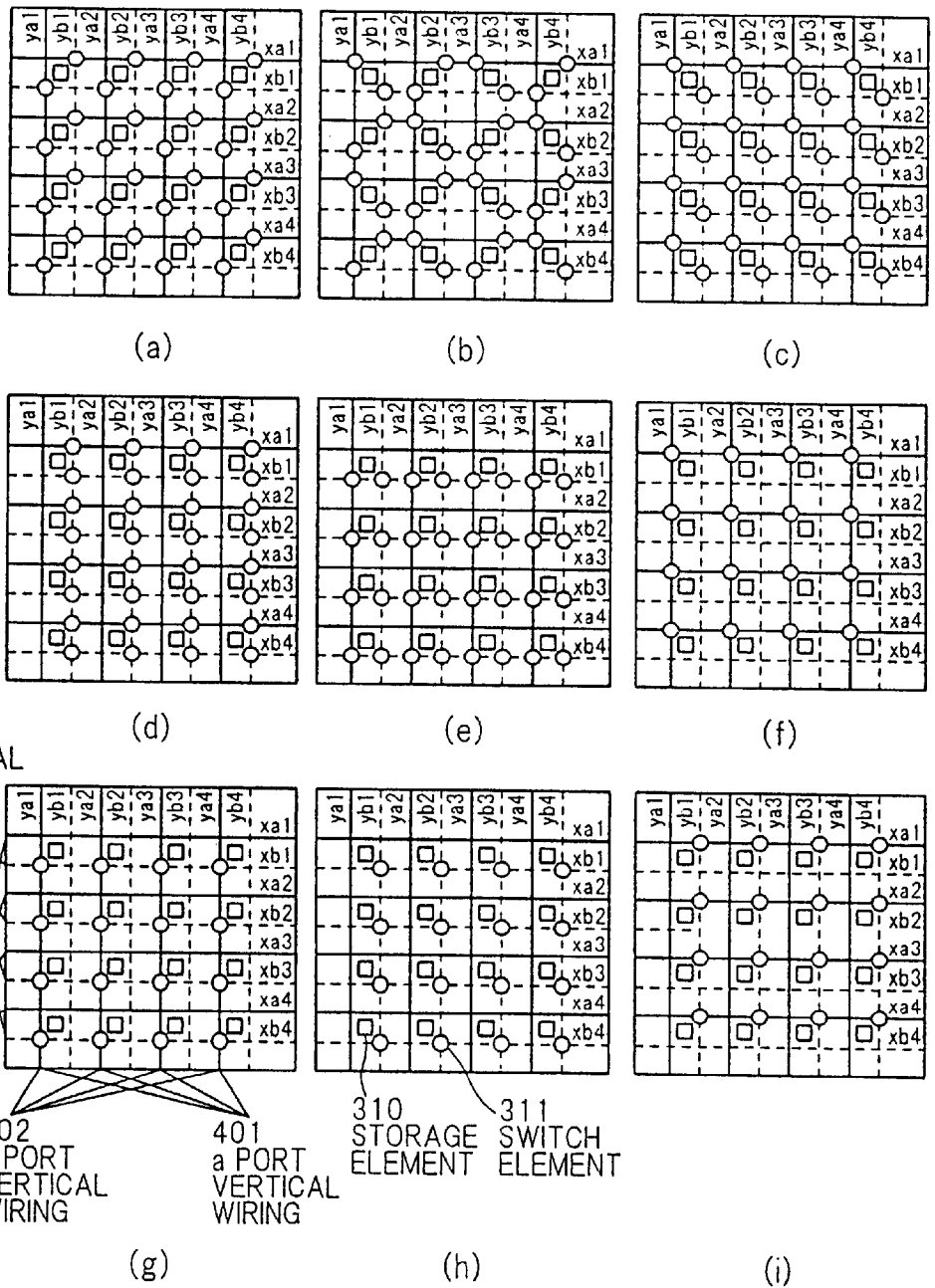
FIG. 10 shows the layouts of switch elements and storage elements in a memory means when using a programmable cell in a embodiment as two sets of crossbar switches.

FIG. 10 shows the layouts of switch elements 311 and storage elements 310 in a memory means when using a programmable cell as two sets of crossbar switches.

In this circuit, the switch element 311 can connect wiring group of 8 wiring lines each laid in the vertical and horizontal directions by using information of storage elements 310 disposed like a matrix.

When the programmable cell is used as a crossbar switch as shown in FIG. 10, switch elements 311 maybe disposed at arbitrary positions desired to connect, and as the sub-mode of crossbar switch the configurations in FIG. 10(a) to (i) may be switched. Thereby, not only the connection between same ports (i.e, between a-port vertical wiring 401 and a-port horizontal wiring 403, and between b-port vertical wiring 402 and b-port horizontal wiring 404) but also the connection between different ports (i.e., between a-port wiring and b-port) can be created. Thus, the crossbar switch can offer arbitrary connections between any ports.

Furthermore, by using this crossbar switch, the copy, transfer, exchange and transit of data used typically when connecting two sets of logic gates or 2-port RAM can be configured by the programmable cell. Therefore, the copy, transfer, exchange and transit functions of data, which are conventionally provided by the wiring resource, can be narrowed or reduced. So, the area can be saved.

Figure 11:
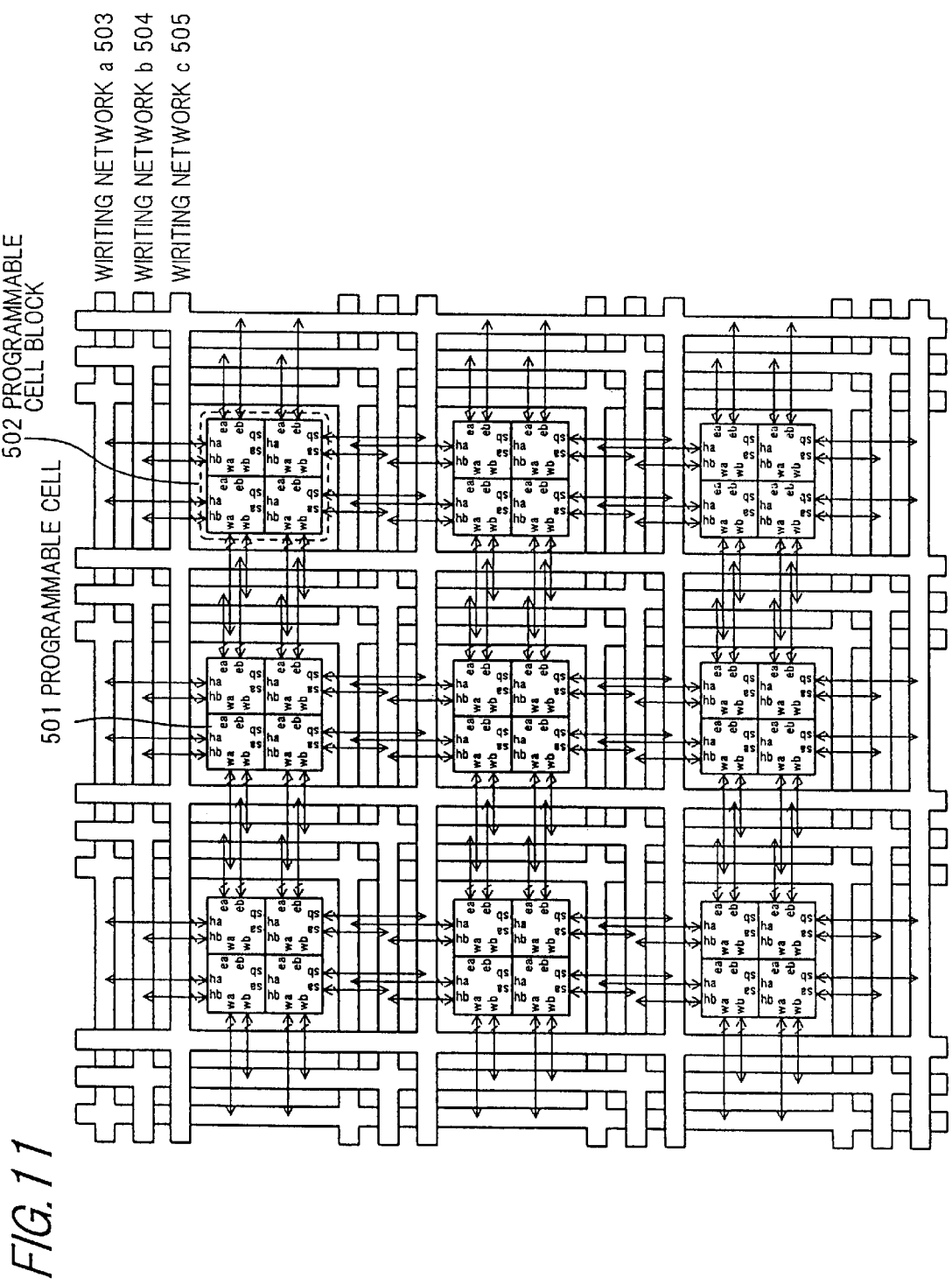
FIG. 11 is a block diagram showing a programmable device in another preferred embodiment of the invention.

FIG. 11 shows a programmable device that programmable cell blocks 502 with programmable cells 501 arrayed are connected by three wiring groups (i.e., wiring network a 503, wiring network b 504 and wiring network c 505).

In this circuit, a programmable cell 501 is connected a neighboring programmable cell 501 through a-port input/output group (na, sa, wa and ea) and b-port input/output group (nb, sb, wb and eb), thereby the programmable cell block 502 is configured, The programmable cell block 502 is connected with wiring network a 503 and wiring network b 504 through a-port input/output group, and is connected with wiring network b 504 and wiring network c 505 through b-port input/output group. Alternatively, optionally, it can be connected with a neighboring programmable cell block 502.

Therefore, the a-port input/output group and b-port input/output group of programmable cell block 502 can be transferred freely through the wiring network group b 504. For example, data common to the a-port input/output group and b-port input/output group can be connected through the wiring network group b 504. So, the efficient wiring can be created.

Further, when combined with the crossbar-switch mode of programmable cell 501, the programmable device can have such a high degree of freedom that the ratio of wiring resource and logic can be changed arbitrarily.

Figure 12:
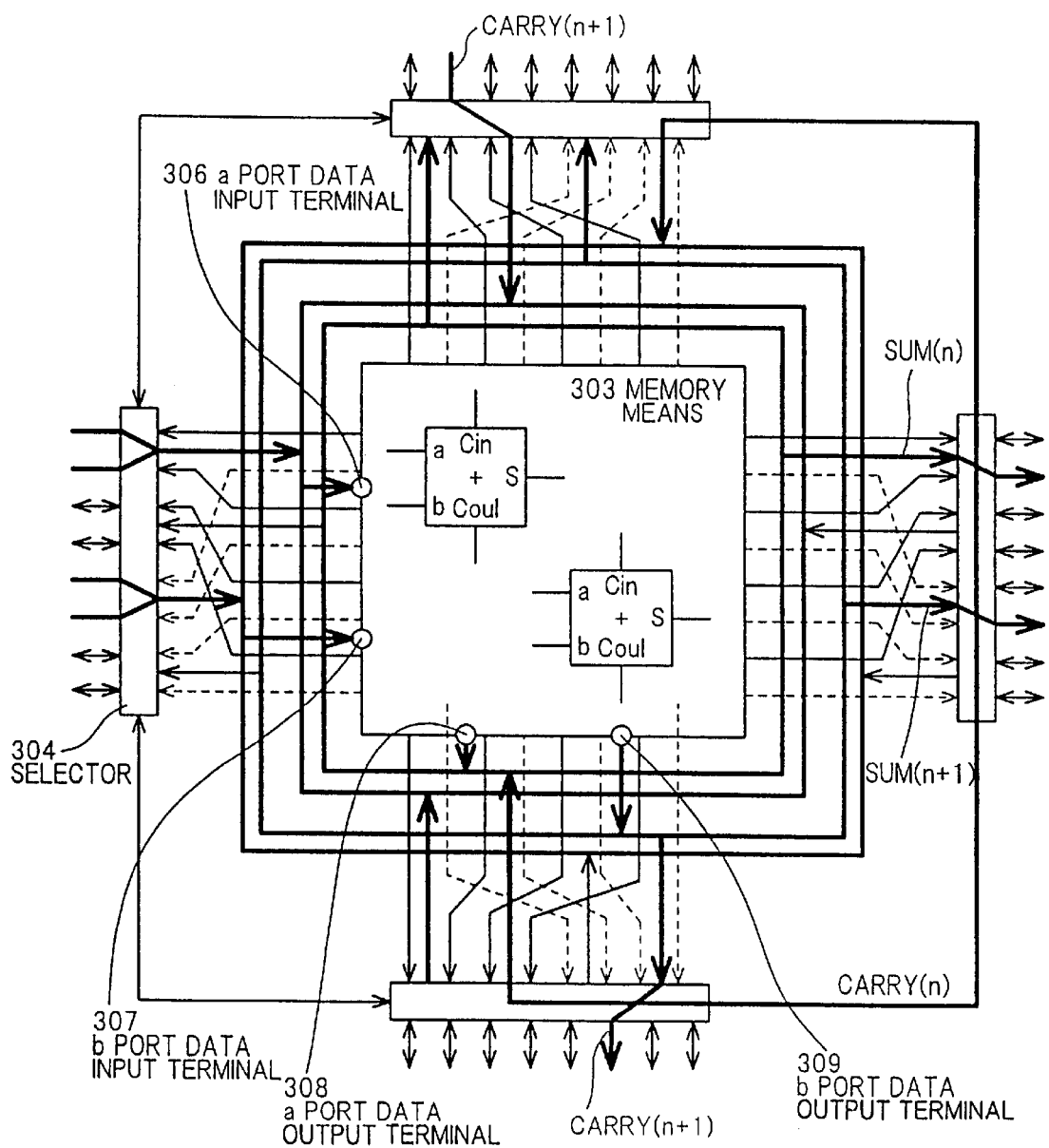
FIG. 12 is a block diagram showing a programmable device in another embodiment, where two full adders are created by the programmable cell in FIG. 9 and two-bit adder is configured by one programmable cell connecting the two full adders.

FIG. 12 shows a programmable device that two full adders are created by the programmable cell in FIG. 9 and two-bit adder is configured by one programmable cell connecting the two full adders, in this circuit, as seen from passages of data shown by heavy lines in FIG. 12, data (An, Bn) input through a-port input/output 301 on the left side of the programmable cell and data (An+1, Bn+1) input through b-port input/output 302 are input to the memory means 303 through the selector 304. Here, to the input of one full adder, Carry(n−1), which is carry signal from low-order bit, other than An and Bn is input from the external of the programmable cell, and then Sum(n) and carry(n) are output. Also, to another full adder, An+1, Bn+1 and Carry(n) are input because of high-order bit operation, and then Sum(n+1) and Carry(n+1) are output.

Thus, by using the programmable cell in this embodiment, an operation circuit for multiple bits can be provided with reduced area.

Figure 13:
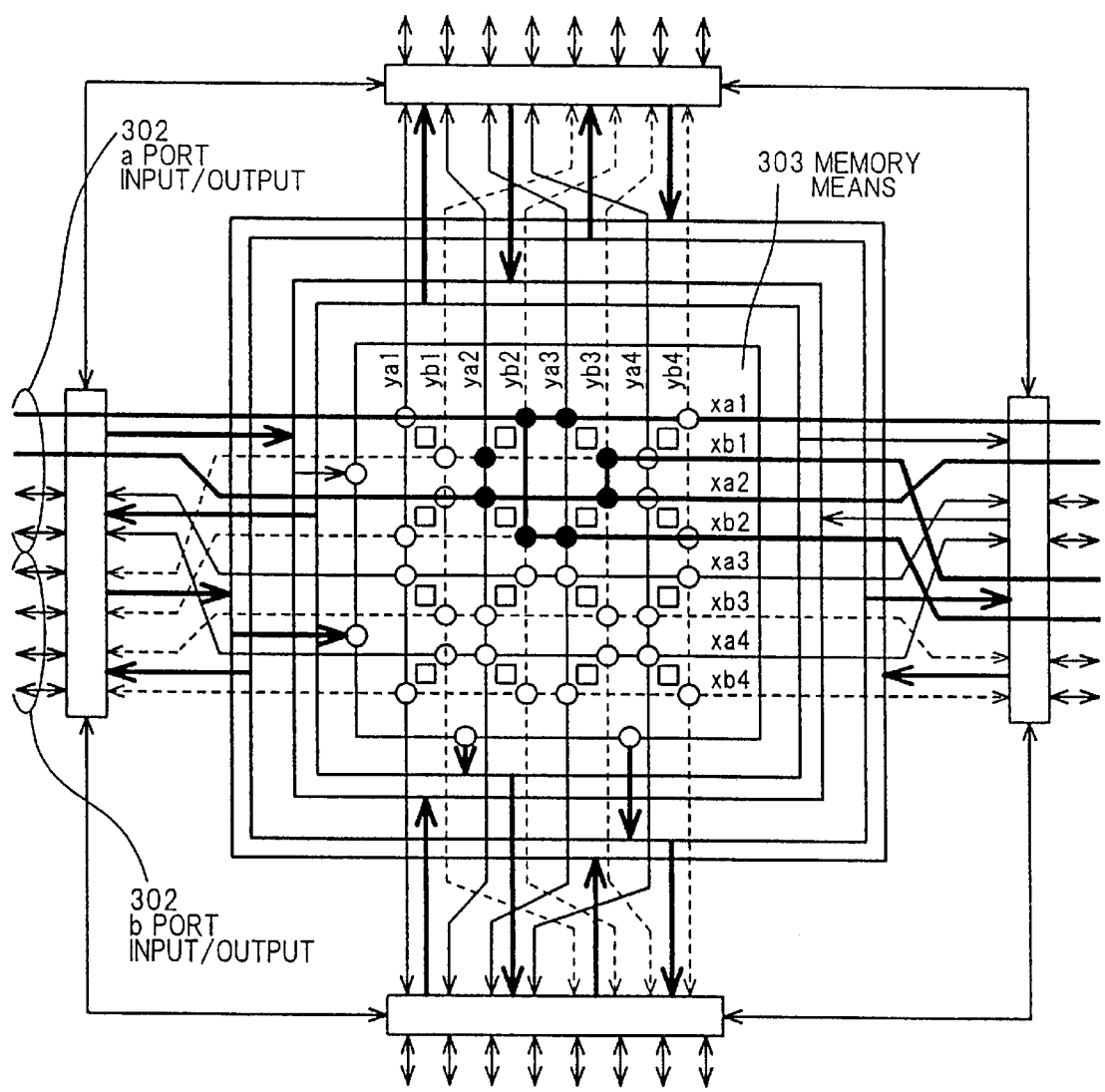
FIG. 13 is a block diagram showing a programmable device in another embodiment, where a crossbar switch is created using the programmable cell in FIG. 9 and the positions of output ports are exchanged while copying 2-bit data.

FIG. 13 shows a composition that a crossbar switch is created using the programmable cell in FIG. 9 and the positions of output ports are exchanged while copying 2-bit data.

Here, as the memory means 303, (b) in FIG. 10 is used, where the transfer between a-port wiring and b-port wiring is enabled.

In operation, signal A and signal B input through a-port input/output 301 on the left side of the programmable cell are output from a-port input/output 301 on the right side of the programmable cell using the transit function of the crossbar switch. Also, by connecting parts shown by mark (●) of the switch elements 311, the output positions of signal A and signal B can be exchanged, therefore signal can be output to the b-port input/output.

Thus, by providing a programmable cell neighboring to the right of this programmable cell, 1-bit operation for (A-B) and (B-A) necessary for absolute-value subtraction circuit can be using one programmable cell.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A programmable device, comprising:
    a programmable cell that operates as programmable logic or memory by internal storage means; and
    a wiring network that is composed of a plurality of wiring lines and determines the line-connection state of a wiring group according to said storage means;
        wherein said programmable cell is provided with n sets of input/output port groups, where n is an integer of 2 or more, and said wiring network is of m sets, where m is an integer of 2 or more.

2. The programmable device, according to claim 1 wherein:
    part or all of the n sets of input/output port groups of said programmable cell is connected commonly with part or all of said wiring network of m sets.

3. The programmable device, according to claim 1 wherein:
    said programmable cell operates as a programmable connection means for lines according to storage information.

4. The programmable device, according to claim 2 wherein:
    said programmable cell operates as a programmable connection means for lines according to storage information.

5. The programmable device, according to claim 1, wherein:
    an input/output port of said programmable cell is connected another input/output port in said programmable cell according to storage information.

6. The programmable device, according to claim 2, wherein:
    an input/output port of said programmable cell is connected another input/output port in said programmable cell according to storage information.

7. The programmable device, according to claim 1, wherein:
    said programmable cells are arrayed and the input/output ports between neighboring programmable cells are connected.

8. The programmable device, according to claim 7, wherein:
    when the programmable cell operates as the programmable connection means for lines according to storage information, the wiring connection within a same set or between different sets is determined by said storage information.

9. The programmable device according to claim 8, wherein:
    said storage information includes wiring mode information to control in a lump the wiring connection within a same set or between different sets in the programmable cell, and wiring matrix connection information to control part of the wiring connection within a same set or between different sets.

10. A programmable device, comprising:
    a two-dimensional array of storage elements;
    at least n decoders to select said storage element, where n is an integer of 2 or more;
    a buffer to input write signal; and
    at least n selectors to output the selected output of said storage element;
        wherein said decoders and said selectors are configured into n groups, the control signal for said n groups is input to said decoders and said selectors, and said storage element is configured into a group that said write signal is written and a group that signal written already is read out.

11. A programmable device, comprising:
    a two-dimensional array of programmable cells; and
    two or more wiring network groups;
        wherein each of the input/output port groups of programmable cell is connected to each of said wiring network groups, and signal with a same or different functions is input to each of said wiring groups.

12. A programmable device, comprising:
    a two-dimensional array of pairs of storage element and switch element; and
    a selector to select one of said pairs;
        wherein data signal, address signal and control signal are input to said selector, said pair is operated as either storage element or switch element according to said control signal, and output from the output port of said pair is output through said selector.

13. A programmable device comprising:
    a programmable cell that operates as programmable logic or memory by internal storage means; and
    a wiring network that is composed of a plurality of wiring lines and determines the line-connection state of a wiring group according to said internal storage means;
        wherein said programmable cell is provided with an input port and n sets of output port groups, where n is an integer of 2 or more, and said wiring network is of m sets, where m is an integer of 2 or more.

14. A programmable device comprising:
    a programmable cell that operates as programmable logic or memory by an internal storage device; and
    a wiring network that is composed of a plurality of wiring lines and determines the line-connection state of a wiring group according to said internal storage device;
        wherein said programmable cell is provided with n sets of input/output port groups, where n is an integer of 2 or more, and said wiring network is of m sets, where m is an integer of 2 or more.

15. The programmable device, according to claim 14, wherein:
    said programmable cell operates as a programmable connection device for lines according to storage information.

16. The programmable device, according to claim 14, wherein:
    an input/output port of said programmable cell is connected another input/output port in said programmable cell according to storage information.

17. The programmable device, according to claim 14, wherein:
    said programmable cells are arrayed and the input/output ports between neighboring programmable cells are connected.

18. The programmable device, according to claim 17, wherein:

when the programmable cell operates as a programmable connection device for lines according to storage information, the wiring connection within a wiring network set or between different wiring network sets is determined by said storage information.

19. The programmable device according to claim 18, wherein:

said storage information includes wiring mode information to control the wiring connection within a wiring network set or between different wiring network sets in the programmable cell, and wiring matrix connection information to control part of the wiring connection within a wiring network set or between different wiring network sets.

20. A programmable device, comprising:

a two-dimensional array of programmable cells, wherein each programmable cell has at least two input/output port groups; and at least two wiring network sets;
wherein each of the input/output port groups of each programmable cell is connected to one of said wiring network sets, and signals with a same or different functions is input to each of said wiring network sets.

21. The programmable device, according to claim 20, wherein:

when each programmable cell operates as a programmable connection device according to storage information, the wiring connection within a wiring network set or between different wiring network sets is determined by said storage information.

22. The programmable device according to claim 21, wherein:

said storage information includes wiring mode information to control the wiring connection within a wiring network set or between different wiring network sets in the programmable cell, and wiring matrix connection information to control part of the wiring connection within a wiring network set or between different wiring network sets.

23. A programmable device, comprising:

a two-dimensional array of storage elements, each storage element having at least n output ports and one input port, where n is an integer of 2 or more;

at least n decoders to select said storage element;

a buffer to input a write signal, wherein said buffer is connected to the input port of each storage element; and at least n selectors to output the selected output of said storage element, wherein said selectors are connected to the output ports of each storage element;
wherein said decoders and said selectors are configured into n groups, the control signal for said n groups is input to said decoders and said selectors, and said storage element is configured into a group that said write signal is written and a group that signal written already is read out.

* * * * *